United States Patent

Lamerichs et al.

[19]

[11] Patent Number: 6,046,589
[45] Date of Patent: Apr. 4, 2000

[54] METHOD AND DEVICE FOR SPECTROSCOPIC MAGNETIC RESONANCE IMAGING

[75] Inventors: Rudolf M. J. N. Lamerichs, Eindhoven, Netherlands; Jan A. Den Hollander, Birmingham, Ala.

[73] Assignee: U.S. Philips Corporation, New York, N.Y.

[21] Appl. No.: 08/996,673

[22] Filed: Dec. 23, 1997

[30] Foreign Application Priority Data

Dec. 23, 1996 [EP] European Pat. Off. .............. 96203698

[51] Int. Cl.[7] ....................................................... G01L 3/00
[52] U.S. Cl. ............................................ 324/309; 324/307
[58] Field of Search ............................................... 324/309

[56] References Cited

U.S. PATENT DOCUMENTS

| | | | |
|---|---|---|---|
| 5,019,784 | 5/1991 | Garwood et al. ....................... | 324/307 |
| 5,327,086 | 7/1994 | Bodenhausen et al. ................. | 324/307 |
| 5,570,019 | 10/1996 | Moonen et al. ........................ | 324/309 |
| 5,617,861 | 4/1997 | Ross et al. ............................ | 128/653.2 |

FOREIGN PATENT DOCUMENTS 9505610  2/1995  WIPO .

OTHER PUBLICATIONS

By A. Haase et al, $^1$H NMR Chemical Shift Selective— (Chess) Imaging, Physics in Medicine and Biology, No 30 1985, p. 341–344.

*Primary Examiner*—Christine K. Oda
*Assistant Examiner*—Tiffany A. Feyner
*Attorney, Agent, or Firm*—Dwight H. Renfrew

[57] ABSTRACT

A method for magnetic resonance imaging of a density distribution of a first substance and a second substance in a part of a body which is arranged in a substantially uniform, steady magnetic field, said first substance having a J-coupling. In order to image the contribution to the MR spectrum by said first substance having the J-coupling separately from the contribution to the MR spectrum by the second substance, repetition of refocusing pulses is used for the generating of the spin echo signals, so that in the direction of a first dimension of a data matrix, in which the measured values are arranged, a phase modulation of 180° occurs in the successive values. Furthermore, the method according to the invention utilizes spatial encoding in which the maximum strength of a phase encoding gradient is equal to half the maximum strength of a corresponding phase encoding gradient used in a customary phase code, so that the field of vision is doubled in comparison with the customary field of vision. After Fourier transformation and integration of the MR spectrum, two separate images of the density distribution of the first substance and the second substance are thus obtained. Lactate is an example of a substance having a J-coupling. Fat is an example of a second substance.

20 Claims, 5 Drawing Sheets k_y → k_x

| -15 | $e_4,e_4,e_4,e_4,e_4,e_4,e_4,e_4,e_4,e_4,e_4,e_4,e_4,e_4,e_4,e_4$ |
| -14 | $e_3,e_3,e_3,e_3,e_3,e_3,e_3,e_3,e_3,e_3,e_3,e_3,e_3,e_3,e_3,e_3$ |
| -13 | $e_4,e_4,e_4,e_4,e_4,e_4,e_4,e_4,e_4,e_4,e_4,e_4,e_4,e_4,e_4,e_4$ |
| -12 | $e_3,e_3,e_3,e_3,e_3,e_3,e_3,e_3,e_3,e_3,e_3,e_3,e_3,e_3,e_3,e_3$ |
| -11 | $e_4,e_4,e_4,e_4,e_4,e_4,e_4,e_4,e_4,e_4,e_4,e_4,e_4,e_4,e_4,e_4$ |
| -10 | $e_3,e_3,e_3,e_3,e_3,e_3,e_3,e_3,e_3,e_3,e_3,e_3,e_3,e_3,e_3,e_3$ |
| -9 | $e_4,e_4,e_4,e_4,e_4,e_4,e_4,e_4,e_4,e_4,e_4,e_4,e_4,e_4,e_4,e_4$ |
| -8 | $e_3,e_3,e_3,e_3,e_3,e_3,e_3,e_3,e_3,e_3,e_3,e_3,e_3,e_3,e_3,e_3$ |
| -7 | $e_2,e_2,e_2,e_2,e_2,e_2,e_2,e_2,e_2,e_2,e_2,e_2,e_2,e_2,e_2,e_2$ |
| -6 | $e_1,e_1,e_1,e_1,e_1,e_1,e_1,e_1,e_1,e_1,e_1,e_1,e_1,e_1,e_1,e_1$ |
| -5 | $e_2,e_2,e_2,e_2,e_2,e_2,e_2,e_2,e_2,e_2,e_2,e_2,e_2,e_2,e_2,e_2$ |
| -4 | $e_1,e_1,e_1,e_1,e_1,e_1,e_1,e_1,e_1,e_1,e_1,e_1,e_1,e_1,e_1,e_1$ |
| -3 | $e_2,e_2,e_2,e_2,e_2,e_2,e_2,e_2,e_2,e_2,e_2,e_2,e_2,e_2,e_2,e_2$ |
| -2 | $e_1,e_1,e_1,e_1,e_1,e_1,e_1,e_1,e_1,e_1,e_1,e_1,e_1,e_1,e_1,e_1$ |
| -1 | $e_2,e_2,e_2,e_2,e_2,e_2,e_2,e_2,e_2,e_2,e_2,e_2,e_2,e_2,e_2,e_2$ |
| -0 | $e_1,e_1,e_1,e_1,e_1,e_1,e_1,e_1,e_1,e_1,e_1,e_1,e_1,e_1,e_1,e_1$ |
| 1 | $e_2,e_2,e_2,e_2,e_2,e_2,e_2,e_2,e_2,e_2,e_2,e_2,e_2,e_2,e_2,e_2$ |
| 2 | $e_1,e_1,e_1,e_1,e_1,e_1,e_1,e_1,e_1,e_1,e_1,e_1,e_1,e_1,e_1,e_1$ |
| 3 | $e_2,e_2,e_2,e_2,e_2,e_2,e_2,e_2,e_2,e_2,e_2,e_2,e_2,e_2,e_2,e_2$ |
| 4 | $e_1,e_1,e_1,e_1,e_1,e_1,e_1,e_1,e_1,e_1,e_1,e_1,e_1,e_1,e_1,e_1$ |
| 5 | $e_2,e_2,e_2,e_2,e_2,e_2,e_2,e_2,e_2,e_2,e_2,e_2,e_2,e_2,e_2,e_2$ |
| 6 | $e_1,e_1,e_1,e_1,e_1,e_1,e_1,e_1,e_1,e_1,e_1,e_1,e_1,e_1,e_1,e_1$ |
| 7 | $e_2,e_2,e_2,e_2,e_2,e_2,e_2,e_2,e_2,e_2,e_2,e_2,e_2,e_2,e_2,e_2$ |
| 8 | $e_3,e_3,e_3,e_3,e_3,e_3,e_3,e_3,e_3,e_3,e_3,e_3,e_3,e_3,e_3,e_3$ |
| 9 | $e_4,e_4,e_4,e_4,e_4,e_4,e_4,e_4,e_4,e_4,e_4,e_4,e_4,e_4,e_4,e_4$ |
| 10 | $e_3,e_3,e_3,e_3,e_3,e_3,e_3,e_3,e_3,e_3,e_3,e_3,e_3,e_3,e_3,e_3$ |
| 11 | $e_4,e_4,e_4,e_4,e_4,e_4,e_4,e_4,e_4,e_4,e_4,e_4,e_4,e_4,e_4,e_4$ |
| 12 | $e_3,e_3,e_3,e_3,e_3,e_3,e_3,e_3,e_3,e_3,e_3,e_3,e_3,e_3,e_3,e_3$ |
| 13 | $e_4,e_4,e_4,e_4,e_4,e_4,e_4,e_4,e_4,e_4,e_4,e_4,e_4,e_4,e_4,e_4$ |
| 14 | $e_3,e_3,e_3,e_3,e_3,e_3,e_3,e_3,e_3,e_3,e_3,e_3,e_3,e_3,e_3,e_3$ |
| 15 | $e_4,e_4,e_4,e_4,e_4,e_4,e_4,e_4,e_4,e_4,e_4,e_4,e_4,e_4,e_4,e_4$ |

FIG. 3

METHOD AND DEVICE FOR SPECTROSCOPIC MAGNETIC RESONANCE IMAGING

BACKGROUND OF THE INVENTION

1. Field of the Invention

The invention relates to a method for magnetic resonance imaging of a density distribution of a first substance and a second substance in a part of a body which is arranged in a substantially uniform, steady magnetic field, the first substance having a J-coupling, which method includes the following steps:

a) exciting spins of the first substance and the second substance in the part of the body by means of an excitation pulse, b) generating pulse sequences for measurement of MR signals which pulse sequences include a series of successive refocusing pulses and first and second gradients in mutually orthogonal first and second directions, respectively, the repetition time between the refocusing pulses in said pulse sequences being substantially equal to the reciprocal value of the J-coupling, c) fitting measured values of the MR signals in a 3-dimensional data matrix, a first and a second dimension of which correspond to the respective gradients in the first direction and the second direction whereas a third dimension corresponds to a measuring time of an MR signal, and d) determining a density distribution of the first substance or the second substance in the part of the body from the data matrix by means of Fourier transformations.

The invention also relates to an MR device for executing this method.

2. Description of Related Art

In the context of the present invention a gradient is to be understood to mean a magnetic field gradient pulse which superposed on the magnetic field yields a magnetic field gradient in a predetermined direction. J-coupling is to be understood to be a spin-spin coupling between a spin state of a first nucleus and a spin state of a second nucleus which is situated near the first nucleus and exhibits a chemical shift which differs from that of the first nucleus. This J-coupling causes a division of a spectral line in the MR spectrum. Generally speaking, this division is small with respect to the chemical shift between the nuclei. Furthermore, the J-coupling is independent of the applied magnetic field.

A method of this kind is known from International patent application WO 95/04610. The known method is used for the spectroscopic imaging of parts of the body so as to study the pathology of the parts imaged with a view to determine whether the pathology is a tumor, an abscess or a lipoma. A lipoma is a fat-filled space in biological tissue. Substances which play a part in this study are substances exhibiting a J-coupling, such as inter alia lactate, and substances which do not exhibit a J-coupling, for example lipids.

The known method utilizes the pulse sequences so as to acquire MR signals containing spatial and spectroscopic information. To this end, the spins within the object are excited and subsequently spatially encoded by the first and second gradients which are applied during the preparation period. The application of the refocusing pulses gives rise to an MR signal. By choosing the repetition time between the refocusing pulses to be equal to the reciprocal value of the J-coupling, a 180° phase modulation occurs in the contribution of the spins of the first substance to the MR signals succeeding the refocusing pulses. After a phase correction and an amplitude correction, the contribution to the MR spectrum by the second substance is reduced by linear combination of the MR signals received. An image of the density distribution of the first substance in the part of the object is determined from the processed MR signals by means of a three-dimensional Fourier transformation. It is a drawback of the known method that the density distribution of the first substance is contaminated by MR spectroscopic information of the second substance.

SUMMARY OF THE INVENTION

It is inter alia an object of the invention to counteract contamination of the image of the density distribution of the first substance. To this end, the method according to the invention is characterized in that the first gradient is generated in such a manner that: in the first dimension of the data matrix a value of the MR signal measured after a refocusing pulse bearing an even sequence number in the series of successive refocusing pulses succeeds a value of the MR signal measured after a refocusing pulse bearing an odd sequence number, a distance between two adjacently situated grid points in a $k_x$ direction in k-space corresponding to the first direction, being equal to $$\frac{\pi}{FOV}$$

where FOV represents the field of view in the first direction. The invention is based on the recognition of the fact that if the measured values of the successive MR signals are fitted in first dimension of the data matrix in the manner indicated above, a 180° phase modulation occurs in the successive values in the data matrix, so that after a three-dimensional Fourier transformation in a result matrix the contribution of the first substance to the MR spectrum in a direction corresponding to the x direction is shifted over a distance equal to the field of view. This is contrary to the customary phase encoding where the distance between two adjacently situated grid points in the $k_x$ direction equals $$\frac{2\pi}{FOV'},$$

where FOV' is the field of view in the first direction of the object in the known method, so that the contribution of the first substance to the MR spectrum coincides with the contribution of the second substance to the MR spectrum. In other words, by doubling the field of view in the first direction in comparison with the customary field of view, the contribution to the spectrum by the first substance remains separate from the contribution to the MR spectrum by the second substance. The shift per se is the result of the 180° phase modulation and the translation properties of a Fourier transformation pair.

A special version of the method according to the invention is characterized in that a selection gradient is applied during the excitation pulse and the refocusing pulses. The selection gradient can be applied in said first and second directions, but also in a direction orthogonal to said first and second directions. A volume of interest to the examination is thus selected within the part of the object.

A further version of the method according to the invention is characterized in that a $k_x$, $k_y$ plane in the k-space comprises two parts, i.e. a first part with low k values and a second part with high k values, and that the pulse sequences comprise two parts: a first part in time and a second part in time, the first gradient being applied in such a manner that the measured values of MR signals succeeding the refocusing pulses in the last part in time of the pulse sequences correspond to the high values of the k space, a $k_y$ direction of the $k_x$, $k_y$ plane that corresponds to the second direction. This step ensures that the first MR signals in the sequence, determining the low-frequency image content of the image of the density distribution, are measured with a comparatively large signal-to-noise ratio in comparison with the later MR signals in the sequence which determine the high-frequency image content.

A further version of the method according to the invention is characterized in that each of said pulse sequences includes four refocusing pulses. Using this number of refocusing pulses in a pulse sequence, an acceptable signal-to-noise ratio is still obtained for the MR signal measured after the last refocusing pulse.

A further version of the method according to the invention is characterized in that the method comprises a further step of generating a saturation of spins of a third substance in the part of the body, which third substance has dominant magnetic resonance properties in relation to the first and the second substance. In this way it is achieved that contributions of the spins of the third substance to the MR signals are suppressed and the MR signals generated are determined mainly by the spins of the first and second substances.

A further version of the method according to the invention is characterized in that the third substance contains water. By choosing water for the third substance, it is achieved that the contributions of the spins of water to the MR signals are suppressed and the MR signals generated are determined mainly by the spins of the first and the second substance.

A further version of the method according to the invention is characterized in that the first substance contains lactate. As a result of this step, the density distribution of lactate is reproduced.

A further version of the method according to the invention is characterized in that the second substance contains choline, creatine, N-acetyl aspartate or fat. This step enables reproduction of the density distribution of one of the latter substances separately from the density distribution of the first substance and study of the metabolism of metabolites within the part of the object.

The invention also relates to an MR device whose control unit is arranged to carry out the following steps:
  a) exciting spins of the first substance and the second substance in the part of the body by means of an excitation pulse,
  b) generating pulse sequences for measurement of MR signals, which include a series of successive refocusing pulses and first and second gradients in mutually orthogonal first and second directions, respectively, the repetition time between the refocusing pulses in said pulse sequences being substantially equal to the reciprocal value of the J-coupling,
  c) fitting measured values of the MR signals in a 3-dimensional data matrix, a first and a second dimension of which correspond to the respective gradients in the first direction and the second direction whereas a third dimension corresponds to the measuring time of an MR signal,
  d) determining a density distribution of the first substance or the second substance in the part of the body from the data matrix by means of Fourier transformations, the control unit also being arranged to apply the first gradient in such a manner that: in the first dimension of the data matrix a value of the MR signal measured after a refocusing pulse bearing an even sequence number in the series of successive refocusing pulses succeeds a value of the MR signal measured after a refocusing pulse bearing an odd sequence number, a distance between two adjacently situated grid points in a $k_x$ direction, corresponding to the first direction, being equal to $$\frac{\pi}{FOV},$$

where FOV represents the field of view in the first direction.

The above and other, more detailed aspects of the invention will be described in detail hereinafter, by way of example, with reference to the drawing.

BRIEF DESCRIPTION OF THE DRAWINGS

FIG. 3 shows an example of a diagram for the filling of a data matrix,

DETAILED DESCRIPTION OF THE PREFERRED EMBODIMENTS

Figure 1:
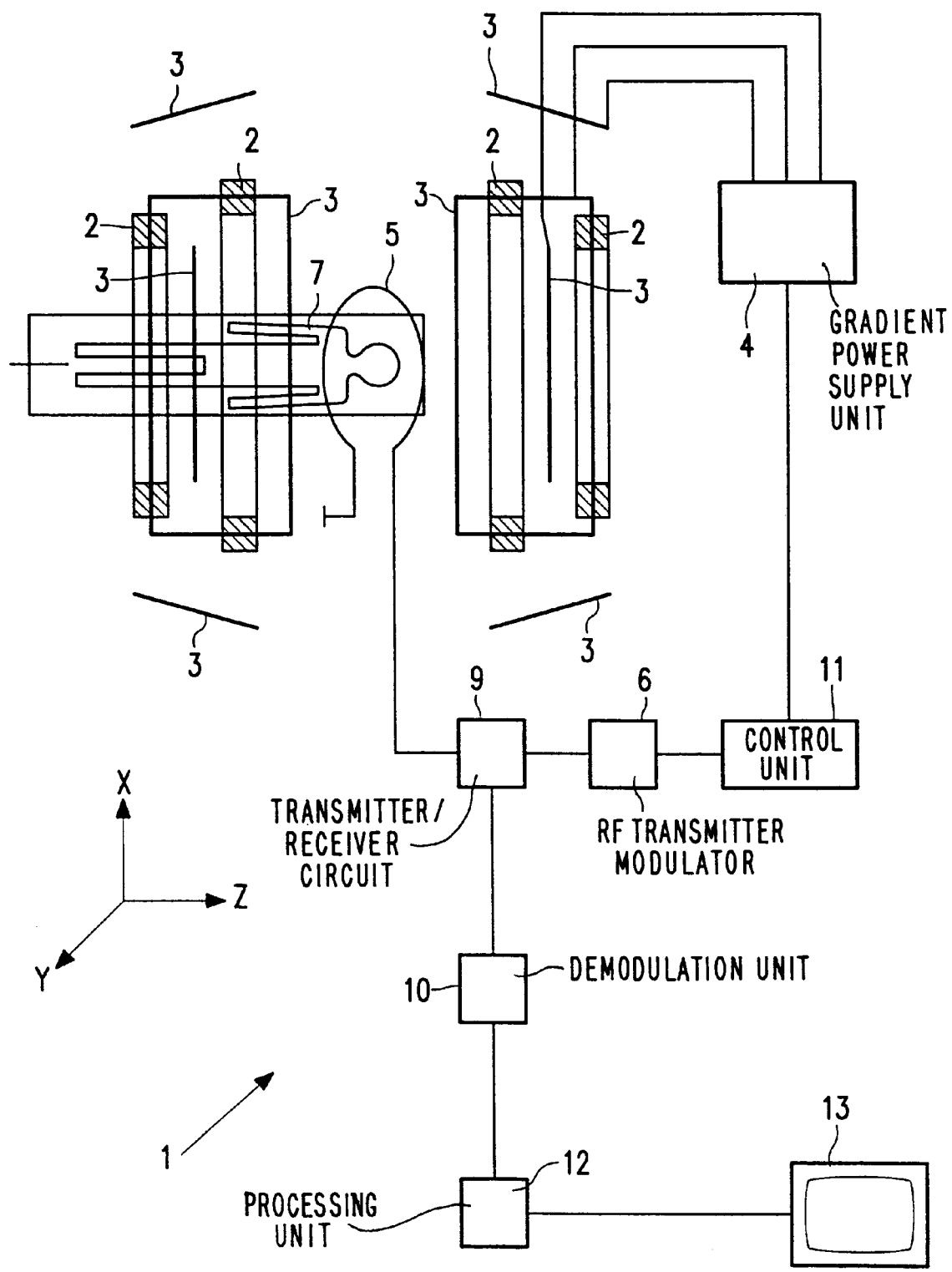
FIG. 1 shows an MR device.

FIG. 1 shows a magnetic resonance device 1 which includes a first magnet system 2 for generating a steady magnetic field, and several gradient coils 3 for generating additional magnetic fields having a gradient in the X, Y, Z directions. The Z direction of the co-ordinate system shown corresponds to the direction of the steady magnetic field in the magnet system 2 by convention. The measuring co-ordinate system x, y, z to be used can be chosen independently of the X, Y, Z system shown in FIG. 1. The gradient coils 3 are fed by the gradient power supply unit 4. The MR device also includes an RF transmitter coil 5 which is connected, via a transmitter/receiver circuit 9, to an RF transmitter modulator 6, and a receiving coil which is connected, via the transmitter/receiver circuit 9, to a demodulation unit 10 and may be the same coil as the RF transmitter coil 5. The MR device 1 also includes a control unit 11, a processing unit 12 and a monitor 13. The magnet system 2 also encloses an examination space which is large enough to accommodate a part of the patient 7 to be examined. The RF transmitter coil 5 is arranged around or on a part of the patient 7 within this examination space. The control unit 11 controls the RF transmitter and modulator 6 and the power supply unit 4 so as to generate special pulse sequences which contain RF pulses and gradients for the generating of MR signals. The demodulation unit 10 determines the phases and amplitudes of the MR signals received by means of the receiving coil. Subsequently, the phases and amplitudes determined are applied to a processing unit 12. The processing unit 12 processes the information presented so as to form an image by Fourier transformation. This image can be visualized, for example by means of a monitor 13.

The method for imaging a density distribution of a first substance and a second substance by means of magnetic resonance according to the invention will be described in detail hereinafter, by way of example, on the basis of the metabolism of a part of a human body, for example a part of the head. Lactate is an example of a first substance exhibiting a J-coupling. The lactate exhibits a J-coupling in the MR spectrum of 7.2 Hz. Examples of a second substance, not having a J-coupling, are choline, creatine, N-acetyl aspartate or fat. Hereinafter, fat is chosen as the second substance. Both lactate and fat occur in brain tissue in the head and are of importance in determining whether a pathology contains a tumor, an abscess or lipoma. In order to generate a signal which contains both spectral and spatial information of the head of the body, a pulse sequence is generated which contains an excitation pulse, gradients and successive refocusing pulses.

Figure 2:
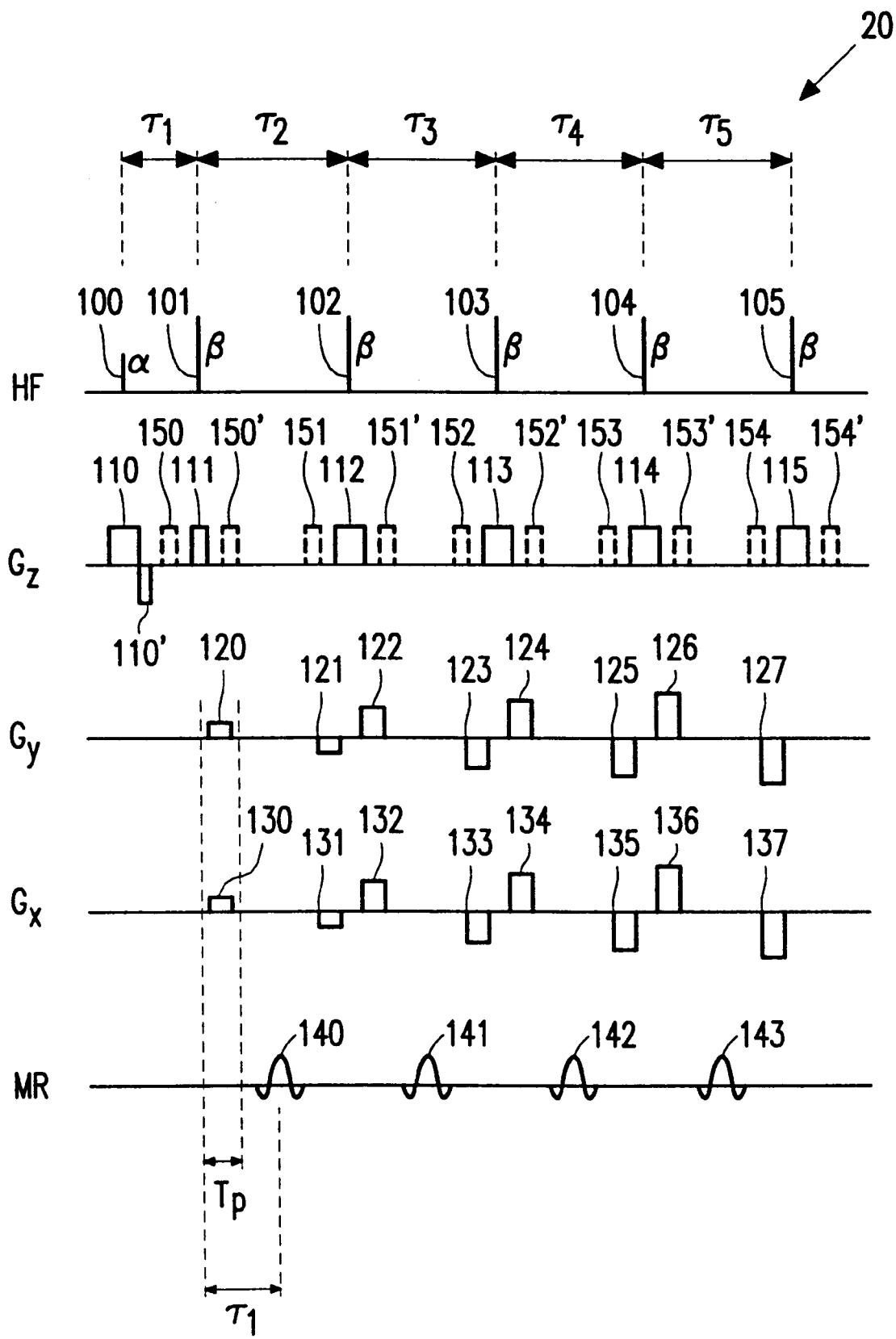
FIG. 2 shows an example of a pulse sequence.

FIG. 2 shows an example of a pulse sequence used to form volume-selective spectroscopic MR images. The known spin echo pulse sequence 20 starts with an excitation pulse 100, having a flip angle β, which pulse is succeeded, after a period of time $\tau_1$, by a first refocusing pulse 101 which has a flip angle β. Generally speaking, the values of α and β amount to 90° and 180°, respectively. After the excitation pulse 100, a Free Induction Decay (FID) MR signal is generated; this MR signal decays very rapidly when the individual spins lose their phase coherence, i.e. become dephased, due to local variations in the magnetic field. The refocusing pulse 101 reverses the direction of spins without affecting the local variations in the magnetic field. Consequently, the spins are rephased. After a period of time $\tau_1$, a spin echo signal 140 will arise. After the spin echo signal 140, the spins are dephased once more. Spin echo signals 141–143 are produced by repeating the refocusing pulses 102–104 which cause successive rephasing of the spins. The repetition times $T_2,T_3,T_4,T_5$ between two refocusing pulses are chosen to be equal to twice the period $T_1$ between the excitation pulse 100 and the first refocusing pulse 101. The amplitude of the spin echo signals 140–143 decreases with a time constant $T_2$ due to non-compensated effects.

In order to render the excitation pulse 100 and the refocusing pulses 101–105 selective within a region of the head, for example a slice in the direction of the x, y plane, use is made of selection gradients as denoted by the line $G_z$ in FIG. 2. A first selection gradient 110 is applied during the excitation pulse 100 and further selection gradients 111–115 are applied during the refocusing pulses 101–103. The dephasing of the spins due to the first selection gradient 110 is compensated by an opposed gradient 110'.

Another possibility of selecting a volume in the head consists in applying a gradient in the x direction during the excitation pulse 100 and a gradient in the z direction during the subsequent refocusing pulses 101–105. In that case the selected volume will be shaped as a bar.

In order to provide a spatial code in the spectrum of the spin echo signals, a first gradient, referred to hereinafter as the first phase encoding gradient 130, and a second gradient, referred to hereinafter as the second phase encoding gradient 120, are applied during a preparation period $T_p$, the directions of said phase encoding gradients corresponding to the x direction and the y direction, respectively, of the co-ordinate system used. The phase encoding gradients 120, 130 are applied during the preparation period $T_p$, after the refocusing pulses 101–104 and before the spin echo signals 140–143. Due to the application of the gradient field $G_c$ and the preparation period $T_p$, the position in the k space is given by the formula:

$$k_c = \gamma \int_0^{T_p} G_c dt,$$

where generally $G_c$ is varied and $T_p$ is kept constant. Moreover, after the measurement of the spin echo signals 140–143 and before the subsequent refocusing pulses 102–105, a first dephasing gradient 121, 123, 125, 127 and a second dephasing gradient 131, 133, 135, 137 are applied; these dephasing gradients are oppositely directed with respect to the first phase encoding gradient 120, 122, 124, 126 and the second phase encoding gradient 130, 132, 134, 136, respectively, and cancel the phase rotation due to the phase encoding again.

By repeating the cycle between the refocusing pulses 101, 102 and also the pulse sequence 20 while varying said first and second gradient, spin echo signals will be measured which correspond to a predetermined set of grid points in the $k_x, k_y$ plane in the k space. The $k_x$ direction of the $k_x, k_y$ plane corresponds to the first phase encoding gradient 130 and the $k_y$ direction corresponds to the second phase encoding gradient 120. In a spectroscopic image of, for example 32×32 volume elements or voxels said set contains 32×32 grid points in the $k_x, k_y$ plane. When the strength of the first and the second phase encoding gradients 120, 130 in the pulse sequences 20 is varied, MR signals will be measured which correspond to said set, the distance between two adjacently situated grid points in the $k_x$ direction then being equal to $$\frac{2\pi}{FOV'},$$

where FOV' is the field of view in the x direction in the known method. The k values in the $k_x$ direction are uniformly distributed in the range $[-k_0, k_0]$, where $k_0$ is determined by $$\frac{\pi}{2\Delta x},$$

where $\Delta x$ represents the resolution in the x direction. The resolution is determined by $$\Delta x = \frac{FOV'}{N},$$

where N represents the number of pixels. Subsequently, the measured spin echo signals 140–143 of successive pulse sequences 20 are taken up in a three-dimensional matrix, a first and a second dimension of which correspond to the $k_x$ direction and the $k_y$ direction, respectively, and a third dimension of which corresponds to the measuring time of the spin echo signals 140–143. A three-dimensional Fourier transformation then yields a three-dimensional result matrix, a first and a second dimension of which correspond to the x axis and the y axis, respectively, whereas a third dimension thereof corresponds to the chemical shift spectrum of the spin echo signal.

Generally speaking, in order to determine the density distribution as a function of the position in the plane, the contribution by a substance to the chemical shift spectrum will be integrated within a given bandwidth. A problem arises in the event of determination of the density distribution of two different substances whose spectra overlap completely or partly, for example as in the case of lactate and fat. The density distribution of lactate will then be contaminated by spectral information of fat. In order to separate the spectral information of lactate and fat, according to a method which is known from the cited International patent application WO 95/05610 the repetition time $T_2, T_3, T_4, T_5$ between two refocusing pulses is chosen to be equal to the reciprocal value of the J coupling. In the present example involving lactate this repetition time equals 1/7.2 s. Thus, with the J-coupling in the lactate a 180° phase modulation occurs in a composite, weighted MR signal. After reconstruction, a density distribution of the lactate contained in the selected slice can be determined from the measured MR signals.

In the method according to the invention, the pulse series 20 is also repeatedly used to measure the spin echo signals so as to form a spectroscopic image of the selected slice of the head, the spin echo signals corresponding to the 32×32 grid points of said set in the $k_x$, $k_y$ plane being measured by application of the first phase encoding gradient 130 and the second phase encoding gradient 120.

With a view to separate the spectral information of the lactate and the fat from one another, the measured values are fitted in the data matrix in such a manner that in the first dimension $k_x$ of the data matrix a value of the spin echo signal 141, 143 measured after a refocusing pulse 102, 104 bearing an even sequence number in the series of successive refocusing pulses 101–104 succeeds a value of the spin echo signal 140, 142 measured after a refocusing pulse 101, 103 bearing an odd sequence number. FIG. 3 shows, by way of example, a table for the sequence of the successive spin echo signals $e_1, e_2, e_3, e_4$. In the $k_x$ dimension in the Table the value of the spin echo signal $e_2, e_4$ succeeding an even refocusing pulse 102, 104 is arranged adjacent the value of the spin echo signal $e_1, e_3$ succeeding an odd refocusing pulse 101, 103. Consequently, a phase modulation of 180° occurs in the values in the first dimension $k_x$ of the data matrix. Furthermore, according to the invention phase encoding is applied, the distance between two adjacently situated grid points in the $k_x$ direction then being equal to $$\frac{\pi}{FOV},$$

where FOV is the field of view in the x direction.

Furthermore, only the measuring values are indicated in the first dimension $k_x$ in the data matrix. The total number of positions in this direction, however, amounts to twice the number of values measured, the non-measured values being made equal to zero. As a result of the code used, the contribution by the lactate to the MR spectrum is shifted over a distance equal to the field of view, due to phase modulation and the translation properties of the Fourier transformation pair after the Fourier transformation, in the direction of the first dimension x of the result matrix, so that in the dimension of the result matrix which corresponds to the chemical shift the contribution by lactate to the MR spectrum is separated from the contribution to the MR spectrum by fat. After integration of the contribution to the MR spectrum by lactate and fat, respectively, an image will be obtained of the density distribution of the lactate and the fat, respectively, in the selected slice.

The difference between the field of view in the x direction as customarily used in the known MR imaging spectrography, and the field of view in the x direction as used in the method according to the invention can be explained as follows. Assume that the customary field of view in the known MR imaging spectrography is, for example 25 cm; in the method according to the invention this field of view in the x direction is doubled to, for example 50 cm, so that the dimension of the slice of the head in the x direction is less than half the customary field of view in the x direction. The number of pixels in the x direction as used in the method according to the invention, however, remains equal to the number of pixels that would be used as the customary field of view in the known method, so that the resolution in the x direction decreases. In order to increase the resolution, the number of pixels can be chosen to be larger again.

For the phase encoding in the $k_y$ direction use is made of the customary phase encoding of the second phase encoding gradient 120, the distance between two adjacently situated grid points in the $k_y$ direction then being equal to $$\frac{2\pi}{FOV_y},$$

where $FOV_y$ represents the field of view in the x direction according to the known method.

In order to enhance the signal-to-noise ratio of the image of the density distribution of the lactate, said set of grid points in the $k_x$, $k_y$ plane can be sub-divided into two parts, i.e. a first part with low k values and a second part with high k values, the pulse sequences 20 for generating the spin echo signals 140–143 also being sub-divided into two parts, i.e. a first part in time and a second part in time. Subsequently, the first phase encoding gradient 130, 132, 134, 136 is applied in such a manner that the measured values of the spin echo signals 140, 141 which succeed the refocusing pulses 101, 102 in the first part in time of the pulse sequences 20 correspond to values in the first part of the k space with the low k values, and that the spin echo signals 142, 143 which succeed the refocusing pulses 103, 104 in the last part in time of the pulse sequences 20 correspond to values in the second part of the k space with the high values of the k space. The advantage thereof resides in the fact that in the regions near the origin of the $k_x$, $k_y$ plane, being important to the image reconstruction, the spin echo signals 140, 141 are measured with comparatively high amplitudes in comparison with the later spin echo signals 142, 143 in the sequence. The Table of FIG. 3 shows this distribution in that the measuring values of the first spin echo signals 140, 142, bearing the sequence number $e_1, e_2$ in the sequence, are arranged at the $k_x$ values bearing the sequence numbers –7, . . . , 0, . . . , 7. The measuring values of the later spin echo signals 142, 143, bearing the sequence number $e_3, e_4$, are arranged at the k values bearing the sequence numbers –15, . . . , –8 and 8, . . . , 15. The table of FIG. 3 includes only sixteen of the 32 steps of the phase encoding in the $k_y$ direction. In order to improve the signal-to-noise ratio of the spin echo signals even further, the number of spin echo signals generated per pulse sequence 20 can be reduced to only two spin echo signals per pulse series.

If the part of the body contains a third substance which offers a dominant MR signal relative to the lactate and the fat, for example water, an additional water-suppressing pulse sequence can be used. An example of such a pulse sequence is the "Chemical Shift Selective Saturation" (CHESS) pulse sequence. This pulse sequence is known from the article $^1$H NMR Chemical Shift Selection—(CHESS) Imaging, by Haase. A et al, Physics in Medicine and Biology, No 30, p. 341, 1985. Said pulse sequence is applied before the excitation pulse 100. As a result, the contribution by the spins of water to the MR signal is reduced relative to the contributions by lactate and fat.

Furthermore, in order to reduce the contribution by the surroundings of the slice selected in the head to the MR signal, so-called "crusher" pulses 150–154 and "decrusher" pulses 150'–154' can be applied. The crusher pulses and decrusher pulses are known from the cited WO 95/05610. The crusher pulses 150–154 are additional gradients which, in the present example, are applied in the z direction before the refocusing pulses 101–105, so that the spins inside and outside the selected slice in the head are dephased. Subsequently, after the refocusing pulses 101–105, decrusher pulses 150'–154' are applied in a direction opposing that of the crusher pulses. The spins inside the selected slice are thus rephased and the spins outside the selected slice are dephased, because the spins outside the selected slice have not been influenced by the refocusing pulses 101–105.

Figure 4:
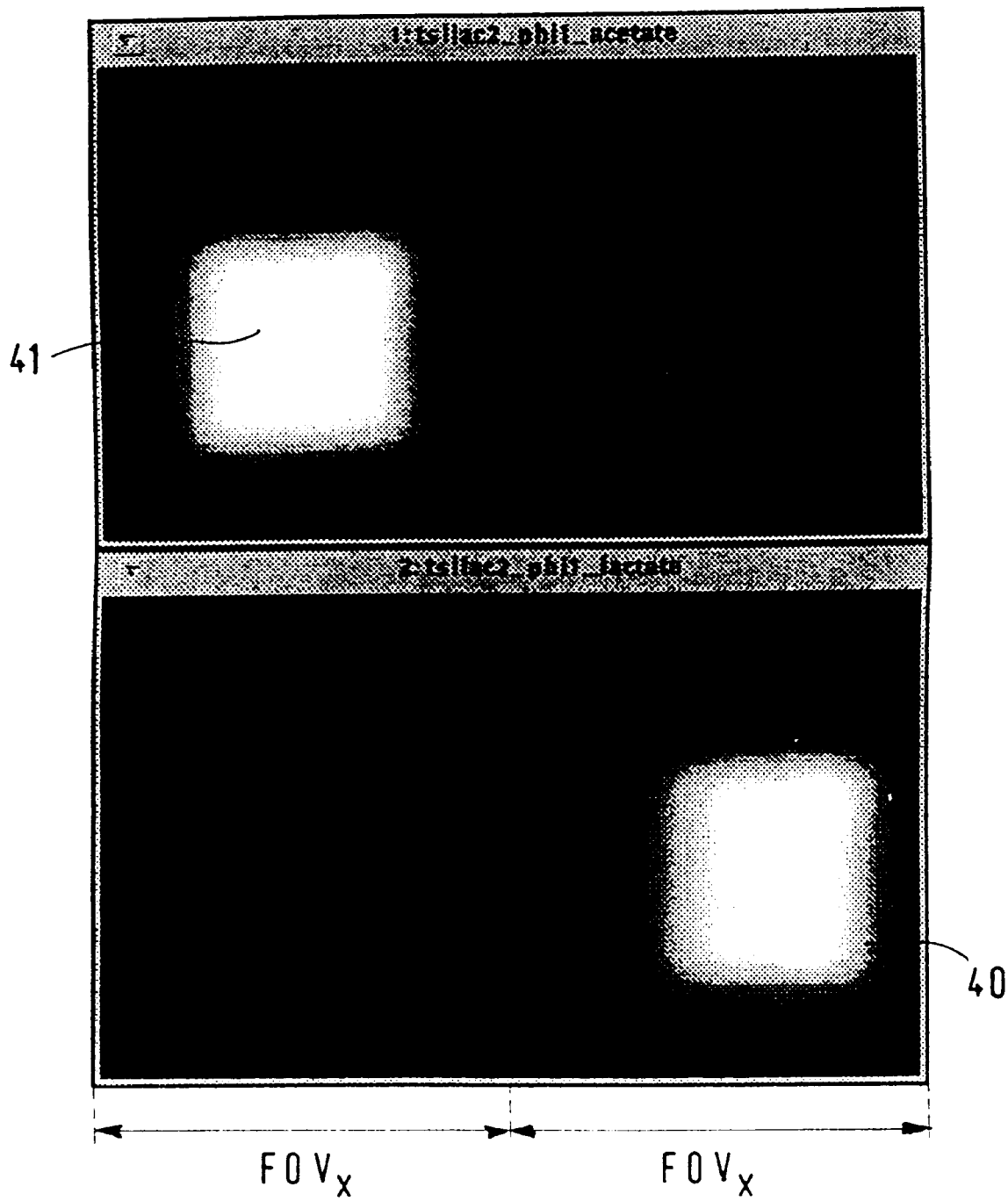
FIG. 4 shows an example of two spectroscopic images of a phantom, separated by means of the method according to the invention.
Figure 5:
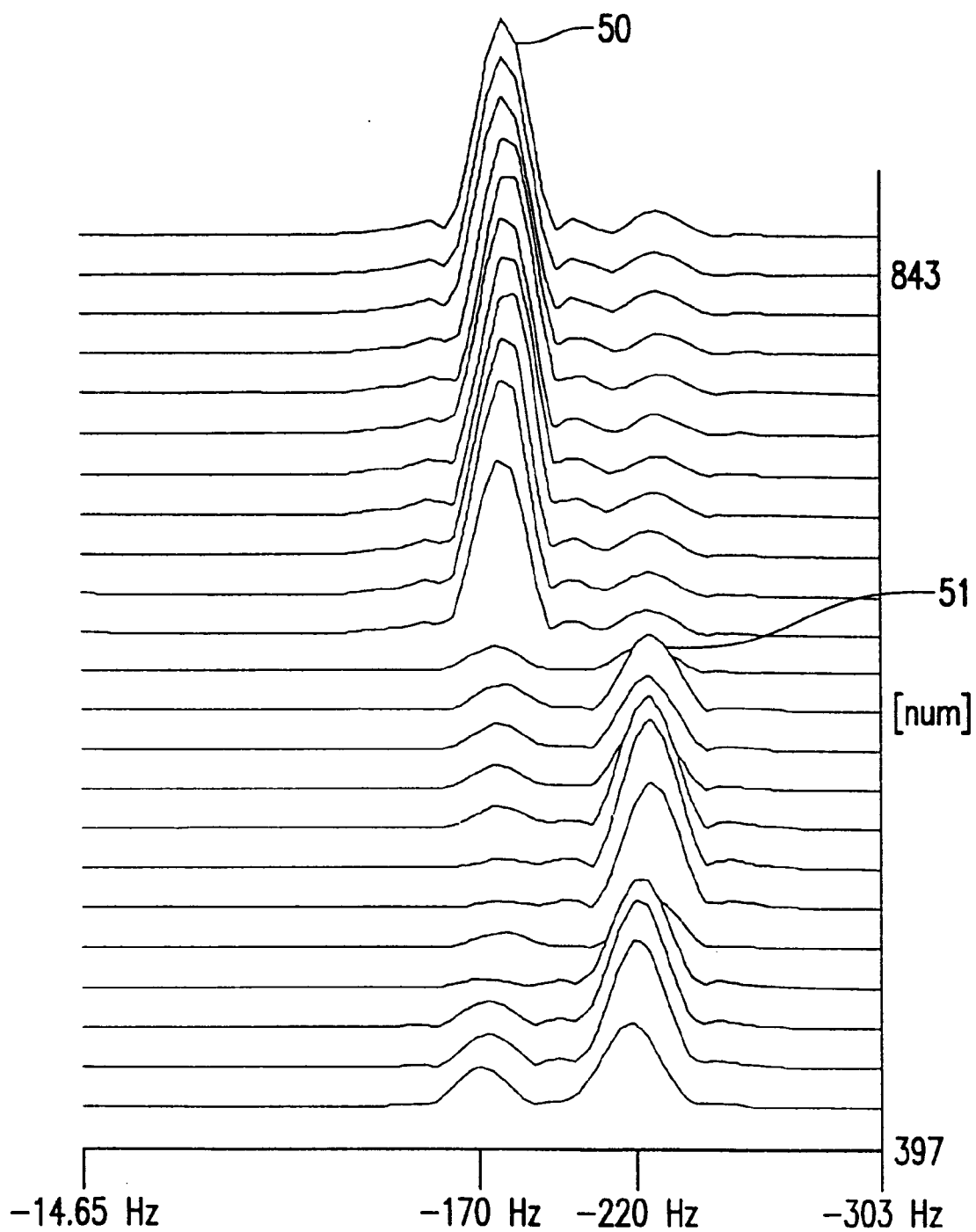
FIG. 5 shows an example of a separated MR spectrum of lactate and fat.

The results of the method according to the invention will be described in detail on the basis of measurements performed on a phantom containing lactate and acetate. FIG. 4 shows an example of two spectroscopic images 40, 41 of a phantom which have been separated by means of the method according to the invention. The first image 41 shows the density distribution of the acetate in the phantom whereas the second image 40 shows the density distribution of the lactate in the phantom. The images have been shifted relative to one another over a distance equal to the field of view. The field of vision $FOV_x$, in FIG. 4 corresponds to half the horizontal dimension of the overall image. Furthermore, FIG. 5 shows examples of MR spectra of lactate and acetate within selected successive voxels of the phantom. The resonance peaks 50 originate from the acetate and the resonance peaks 51 from the lactate. The horizontal axis shows the frequency in Hz relative to the central frequency and the vertical axis shows the energy of the spectrum in arbitrary units. FIG. 5 illustrates the separation of the spectrum of the lactate and that of the acetate, the separation of the peaks of the two resonance spectra being approximately 50 Hz.

A further embodiment of the method according to the invention for magnetic resonance imaging of a density distribution of a first substance and a second substance in a part of a body which is arranged in a substantially uniform, steady magnetic field, the first substance having a J-coupling, includes the following steps:

a) generating a saturation of spins of a third substance in the part of the body, which third substance has dominant magnetic resonance properties in relation to the first and the second substance, b) exciting spins of the first substance and the second substance in the part of the body by means of an excitation pulse, c) generating pulse sequences which include a series of successive refocusing pulses and first and second gradients in a first direction and a second direction, respectively, the repetition time between the refocusing pulses in said pulse sequences being substantially equal to the reciprocal value of the J-coupling, the gradients being chosen so as to be orthogonal and being applied to the steady magnetic field during a preparation period in such a manner that MR signals are measured which correspond to a predetermined set of grid points in a $k_x$, $k_y$ plane in the k space, where the $k_x$ direction corresponds to the first gradient and the $k_y$ direction corresponds to the second gradient, d) fitting the measured values of the MR signals in 3-dimensional data matrix, the first and the second dimension of which correspond to the respective gradients in the first and the second direction whereas a third dimension corresponds to the measuring time, e) determining a density distribution of the first substance or the second substance in the part of the body from the data matrix by means of Fourier transformations, characterized in that the first gradient is generated in such a manner that: in the direction of the first dimension of the data matrix a value of the MR signal measured after a refocusing pulse bearing an even sequence number in the series of successive refocusing pulses succeeds a value of the MR signal measured after a refocusing pulse bearing an odd sequence number, the distance between two adjacently situated grid points in the $k_x$ direction being equal to $$\frac{\pi}{FOV},$$

where FOV is the field of view in the x direction.

All references cited herein, as well as the priority document European Patent Application 96203698.4 filed Dec. 23, 1996, are incorporated herein by reference in their entirety and for all purposes to the same extent as if each individual publication or patent or patent application was specifically and individually indicated to be incorporated by reference in its entirety for all purposes.

We claim:

1. A method for magnetic resonance imaging of a density distribution of a first substance and a second substance in a part of a body which is arranged in a substantially uniform, steady magnetic field, the first substance having a J-coupling, which method includes:

a) exciting spins of the first substance and the second substance in the part of the body by means of an excitation pulse, b) generating pulse sequences for measurement of MR signals which pulse sequences include a series of successive refocusing pulses and first and second gradients in mutually orthogonal first and a second directions, respectively, the repetition time between the refocusing pulses in said pulse sequences being substantially equal to the reciprocal value c) fitting measured values of the MR signals in a 3-dimensional data matrix, a first and a second dimension of which correspond to the respective gradients in the first direction and the second direction whereas a third dimension corresponds to a measuring time of an MR signal, and d) determining a density distribution of the first substance or the second substance in the part of the body from the data matrix by means of Fourier transformations, (i) wherein the first gradient is generated in such a manner that along the first dimension of the data matrix a value of the MR signal measured after a refocusing pulse bearing an even sequence number, in the series of successive refocusing pulses, follows a value of the MR signal measured after a refocusing pulse bearing an odd sequence number, (ii) wherein a distance between two adjacently situated grid points along the first dimensions equals n/FOV, where FOV represents the field of view in the first direction, and (iii) wherein non-measured vales in the data matrix are ser to zero.

2. A method as claimed in claim 1, characterized in that a selection gradient is applied during the generating of the excitation pulse and the refocusing pulses.

3. A method as claimed in claim 1, characterized in that a $k_x$, $k_y$ plane in k-space comprises two parts, i.e. a first part with low k values and a second part with high k values, and that the pulse sequences comprise two parts: a first part in time and a second part in time, the first gradient being applied in such a manner that the measured values of MR signals succeeding the refocusing pulses in the last part in time of the pulse sequences correspond to the high values of the k space, a $k_y$ direction of the $k_x$, $k_y$ plane corresponds to the second direction.

4. A method as claimed in claim 1, characterized in that each of said pulse sequences includes four refocusing pulses.

5. A method as claimed in claim 1, characterized in that the method comprises a further step of generating a saturation of spins of a third substance in the part of the body, which third substance has dominant magnetic resonance properties in relation to the first and the second substance.

6. A method as claimed in claim 5, characterized in that the third substance contains water.

7. A method as claimed in claim 1, characterized in that the first substance contains lactate.

8. A method as claimed in, characterized in that the second substance contains choline, creatine, N-acetyl aspartate or fat.

9. An MR device for imaging of a density distribution of a first substance and a second substance in a part of a body, the first substance having a J-coupling, the MR device including means for sustaining the steady magnetic field, means for generating RF pulses, means for generating gradients, a control unit for generating control signals for the means for generating the RF pulses and for the means for generating the gradients, means for receiving and sampling the magnetic resonance signals, a processing unit for processing the sampled magnetic resonance signals, the control unit being arranged to carry out the following steps:
  a) exciting spins of the first substance and the second substance in the part of the body by means of an excitation pulse,
  b) generating pulse sequences for measurement of MR signals which pulse sequences include a series of successive refocusing pulses and first and second gradients in mutually orthogonal first and second directions, respectively, the repetition time between the refocusing pulses in said pulse sequences being substantially equal to the reciprocal value of the J-coupling,
  c) fitting measured values of the MR signals in a 3-dimensional data matrix, a first and a second dimension of which correspond to the respective gradients in the first direction and the second direction whereas a third dimension corresponds to a measuring time of an MR signal, and
  d) determining a density distribution of the first substance or the second substance in the part of the body from the data matrix by means of Fourier transformations,
    (i) wherein along the first dimension of the data matrix a value of the MR signal measured after a refocusing pulse bearing an even sequence number, in the series of successive refocusing pulses, follows a value of the MR signal measured after a refocusing pulse bearing an odd sequence number,
    (ii) wherein a distance between two adjacently situated grid points along the first dimension equals n/FOv, where FOV represents the field of view in the first direction, and
    (iii) wherein non-measured values in the data matrix are set to zero.

10. A method as claimed in claim 2, characterized in that a $k_x$, $k_y$ plane in k-space comprises two parts, i.e. a first part with low k values and a second part with high k values, and that the pulse sequences comprise two parts: a first part in time and a second part in time, the first gradient being applied in such a manner that the measured values of MR signals succeeding the refocusing pulses in the last part in time of the pulse sequences correspond to the high values of the k space, a $k_y$ direction of the $k_x$, $k_y$ plane corresponds to the second direction.

11. A method as claimed in claim 2, characterized in that each of said pulse sequences includes four refocusing pulses.

12. A method as claimed in claim 3, characterized in that each of said pulse sequences includes four refocusing pulses.

13. A method as claimed in claim 10, characterized in that each of said pulse sequences includes four refocusing pulses.

14. A method as claimed in claim 2, characterized in that the method comprises a further step of generating a saturation of spins of a third substance in that part of the body, which third substance has dominant magnetic resonance properties in relation to the first and the second substance.

15. A method as claimed in claim 3, characterized in that the method comprises a further step of generating a saturation of spins of a third substance in that part of the body, which third substance has dominant magnetic resonance properties in relation to the first and the second substance.

16. A method as claimed in claim 4, characterized in that the method comprises a further step of generating a saturation of spins of a third substance in that part of the body, which third substance has dominant magnetic resonance properties in relation to the first and the second substance.

17. A method as claimed in claim 10, characterized in that the method comprises a further step of generating a saturation of spins of a third substance in that part of the body, which third substance has dominant magnetic resonance properties in relation to the first and the second substance.

18. A method as claimed in claim 11, characterized in that the method comprises a further step of generating a saturation of spins of a third substance in that part of the body, which third substance has dominant magnetic resonance properties in relation to the first and the second substance.

19. A method as claimed in claim 12, characterized in that the method comprises a further step of generating a saturation of spins of a third substance in that part of the body, which third substance has dominant magnetic resonance properties in relation to the first and the second substance.

20. A method as claimed in claim 13, characterized in that the method comprises a further step of generating a saturation of spins of a third substance in that part of the body, which third substance has dominant magnetic resonance properties in relation to the first and the second substance.

* * * * *